United States Patent [19]

Kane et al.

[11] Patent Number: 5,218,273
[45] Date of Patent: Jun. 8, 1993

[54] MULTI-FUNCTION FIELD EMISSION DEVICE

[75] Inventors: Robert C. Kane, Woodstock; Ross E. Ruthenberg, Wood Dale, both of Ill.

[73] Assignee: Motorola, Inc., Schaumburg, Ill.

[21] Appl. No.: 647,313

[22] Filed: Jan. 25, 1991

[51] Int. Cl.$^5$ .......................... H01J 1/02; H01J 11/04
[52] U.S. Cl. .................. 315/326; 315/334; 313/309; 313/336
[58] Field of Search .............. 315/326, 334, 335, 337, 315/261, 339; 313/309, 336, 351; 307/304, 299.1

[56] References Cited

U.S. PATENT DOCUMENTS

| | | |
|---|---|---|
| 2,516,915 | 8/1950 | Reeves ................................. 315/335 |
| 3,374,397 | 3/1968 | Krayenbrink ....................... 315/334 |
| 3,755,704 | 8/1973 | Spindt et al. ........................ 313/309 |
| 3,789,471 | 2/1974 | Spindt et al. ........................ 29/25.17 |
| 3,812,559 | 5/1974 | Spindt et al. ........................ 29/25.18 |
| 3,894,332 | 7/1975 | Nathanson et al. . |
| 3,921,022 | 11/1975 | Levine . |
| 3,970,887 | 7/1976 | Smith et al. . |
| 3,998,678 | 12/1976 | Fukase et al. . |
| 4,008,412 | 2/1977 | Yuito et al. . |
| 4,178,531 | 12/1979 | Alig . |
| 4,307,507 | 12/1981 | Gray et al. . |
| 4,513,308 | 4/1985 | Greene et al. . |
| 4,578,614 | 3/1986 | Gray et al. . |
| 4,663,559 | 5/1987 | Christensen ........................ 313/336 |
| 4,685,996 | 8/1987 | Busta et al. . |
| 4,721,885 | 1/1988 | Brodie ................................. 313/576 |
| 4,827,177 | 5/1989 | Lee et al. ............................ 313/306 |
| 4,874,981 | 10/1989 | Spindt ................................. 313/309 |
| 4,901,028 | 2/1990 | Gray et al. . |
| 5,012,153 | 4/1991 | Atkinson et al. ................... 307/304 |

FOREIGN PATENT DOCUMENTS

| | | |
|---|---|---|
| 0172089 | 7/1985 | European Pat. Off. . |
| 2604823 | 10/1986 | France . |
| 855782 | of 0000 | U.S.S.R. . |
| 2204991A | 11/1988 | United Kingdom . |

OTHER PUBLICATIONS

A Vacuum Field Effect Transistor Using Silicon Field Emitter Arrays, by Gray, 1986 IEDM.
Advanced Technology: flat cold-cathode CRTs, by Ivor Brodie, Information Display Jan. 1989.
Field-Emitter Arrays Applied to Vacuum Flourescent Display, by Spindt et al. Jan., 1989 issue of IEEE Transactions on Electronic Devices.

Primary Examiner—Eugene R. LaRoche
Assistant Examiner—Son Dinh
Attorney, Agent, or Firm—Eugene A. Parsons

[57] ABSTRACT

An electronic device that provides a multiplicity of electronic circuit functions within a single device package by utilizing a plurality of field emission devices wherein at least some of the field emission devices are employed to perform more than a single circuit function.

15 Claims, 4 Drawing Sheets

5,218,273

MULTI-FUNCTION FIELD EMISSION DEVICE

FIELD OF THE INVENTION

This invention relates generally to cold-cathode field emission devices, including but not limited to cold-cathode field emission devices employed in electronic circuits performing a plurality of electronic functions.

BACKGROUND OF THE INVENTION

Cold-cathode field emission devices (FEDs) are known in the art. These prior art devices typically feature electric field induced electron emission from regions exhibiting geometric discontinuities of small radius of curvature. In some prior art embodiments the FEDs may be constructed in a substantially vertical orientation wherein emitted electrons are collected by an anode that is non-coplanar with respect to the electron emitter. In other prior art embodiments the anode may be formed on the same supporting structure on which the emitter resides. Further, FEDs employed in signal processing applications generally include a gate electrode for modulating the rate of electron emission. As described the FEDs of the prior art may be employed for a broad variety of electronic applications as part of communication and/or computing systems.

An inherent characteristic of many electronic systems, such as communication or computing systems, in which active devices, such as semiconductor devices or FEDs, are employed is that as system complexity increases, the number of active device stages must also increase. This increase supports a proportional increase in system cost and has an adverse effect on system reliability. Since the trend in the electronics industry is towards systems of increasing complexity, this inherent characteristic presents a serious detriment to reliable system performance and cost effectiveness.

Accordingly, there exists a need for a new device that overcomes at least some of these disadvantages of prior art devices.

SUMMARY OF THE INVENTION

This need and others are substantially met through provision of a multi-function field emission device. This device includes generally a plurality of cold cathode electron emitters and a coupling mechanism for coupling the emitters together, such that a drive signal applied to one of the emitters will be simultaneously applied to all emitters. The device further includes first and second anode mechanisms, wherein the first anode mechanism is disposed proximal to all of the emitters, and the second anode is disposed proximal to at least some of the emitters as well.

In one embodiment, when the second anode mechanism operates, the second anode mechanism will collect substantially all electrons emitted by the emitters disposed proximal thereto, regardless of whether the first anode mechanism also operates in a collecting mode.

In another embodiment, a plurality of gate mechanisms can be positioned proximal to various groups of the emitters to allow selective controlled extraction of electron emission from the emitters.

DESCRIPTION OF A PREFERRED EMBODIMENT

Figure 1:
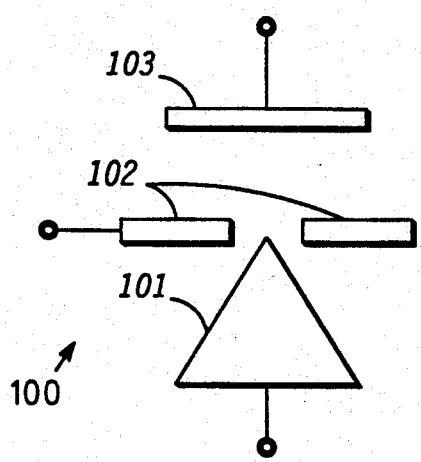
FIG. 1 is a schematic representation of an FED.

FIG. 1 depicts a schematic representation of an FED commonly used in the art. The FED (100) has three electrodes, including an emitter electrode (101) for emitting electrons, a gate extraction electrode (102) (annular in shape and shown here in cross section) proximally disposed with respect to the emitter electrode (101) (for inducing an electric field substantially between the gate extraction electrode (102) and the emitter electrode (101), which electric field will be favorably enhanced at a region of geometric discontinuity of small radius of curvature located substantially on the surface of the emitter electrode (101)) and an anode electrode (103) for collecting at least some of any electrons emitted from the emitter electrode (101). FEDs employing additional electrodes are known and may be similarly schematically represented to illustrate the additional electrodes as appropriate.

It may be noted that the anode electrode, as described herein, is not necessarily required to achieve field induced electron emission. An FED may include only a gate extraction electrode proximally disposed with respect to an emitter electrode.

Figure 2:
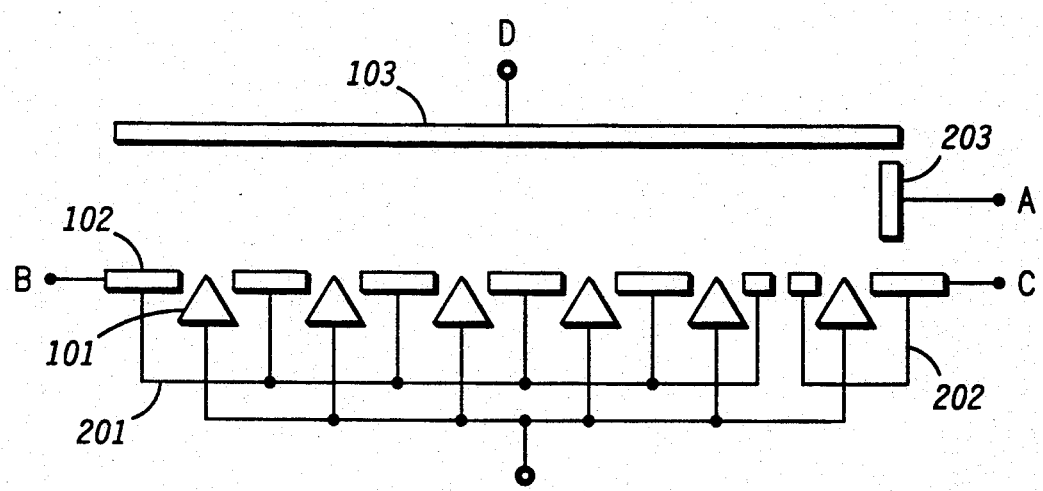
FIG. 2 is a schematic representation of a first embodiment multi-function FED in accordance with the present invention.

FIG. 2 depicts a first embodiment of a multi-function FED in accordance with the present invention. This embodiment includes a plurality of basic FEDs, each having an emitter electrode (101) and a gate extraction electrode (102). Additionally, a plurality of anode electrodes comprising at least a first anode electrode (103) and a second anode electrode (203) are provided and preferentially distally disposed with respect to each of the plurality of basic FEDs. (The plurality of basic FEDs may include an array of millions of individual FEDs. For ease of illustration, the schematic depictions will show only a representative few FEDs.) The second anode electrode (203) is shown associated with a particular one of the basic FEDs. This schematic representation serves only to indicate that the second anode electrode (203) is associated with at most a group of FEDs of the plurality of FEDs. Further, FIG. 2 shows that the first anode electrode (103) is associated with substantially all of the plurality of FEDs.

FIG. 2 further depicts that the gate extraction electrodes (102) of the plurality of FEDs have been selectively independently electrically interconnected in a manner that forms groups of FEDs. It is also anticipated that the depicted selective interconnection may provide that at least some of the FEDs of the plurality of FEDs may remain as individual FEDs not associated with a group of FEDs. A first group of FEDs is shown as being realized by a first selective electrical interconnect (201), which may be implemented by any of the known methods, including conductive metalizations, wire bonding, or semiconductor doping. A second group of FEDs is schematically depicted as having a second selective electrical interconnect (202).

As is commonly known in the art, FEDs are placed into operation to perform electronic functions by providing to the various electrodes suitable potentials and signals. In FIG. 2, such potentials and signals may be applied as indicated at the points A, B, C, and D. In a physical embodiment these points A, B, C, and D correspond to conductive lines or pads made available to access the device to external circuitry, potentials, or signal sources.

These points may be selectively preferentially excited by applying external potentials and signals, such that in a first mode of operation substantially all of the FEDs of all of the groups of FEDs function in concert, with points B and C being selectively electrically interconnected to a single external potential and/or single external signal and wherein the potentials applied to points C and D are such that substantially all of any emitted electrons are collected by the first anode electrode (103). In this first mode of operation the multi-function FED may employ substantially the entire array of FEDs.

Alternatively, in a second mode of operation the same multi-function FED may be selectively electrically energized at the points schematically depicted as A and B by providing dis-similar external potentials and/or external sources or, in some instances, by selectively providing no external potential or external source to one of points A or B while simultaneously providing a desired external potential and/or external signal to the other of points A or B. This second mode of operation is further characterized by selectively applying dis-similar external potentials to points C and D such that substantially all of any emitted electrons are collected by the second anode electrode (203). In the described second mode of operation the multi-function FED employs, at most, a part of the plurality of FEDs.

In a third mode of operation external potentials and/or external signals may be preferentially independently applied to points A, B, C, and D, such that the group of FEDs associated with the first selective electrical interconnect (201) and the group of FEDs associated with the second selective electrical interconnect (202) will both be operational but not necessarily operating in concert. Further, in this mode of operation external potentials applied to points C and D will provide that substantially all of any emitted electrons will be collected at the first anode electrode (103). In this mode of operation the multi-function FED may be usefully employed, for example, to provide a signal mixing function.

In a fourth mode of operation external potentials and/or external signals may be preferentially independently applied to points A, B, C, and D, such that the group of FEDs associated with the first selective electrical interconnect (201) and the group of FEDs associated with the second selective electrical interconnect (202) will both be operational but not necessarily operating in concert. Further, in this mode of operation external potentials applied to points C and D will provide that at least some of substantially all of any emitted electrons are collected by each of the first anode electrode (103) and second anode electrode (203), and that the second anode electrode (203) will substantially collect only electrons emitted by the FED or plurality of FEDs associated with the second selective electrical interconnect (202). In this mode of operation the multi-function FED may be utilized, for example, in an application where the device will preferentially provide, in addition to a preferred primary function, an integral sampler function.

Figure 3A:
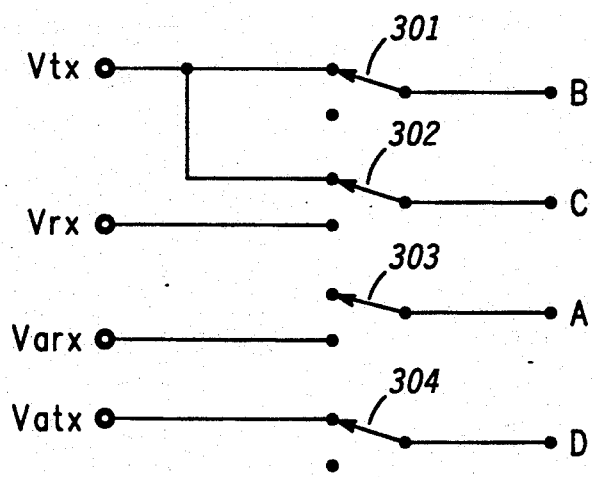
FIGS. 3A-3B are schematic representations of switching schemes that may be employed to select preferred modes of operation of a multi-function FED of the present invention.

FIG. 3A depicts a possible arrangement of externally provided signals and potentials that may be applied to points A, B, C, and D. A first switch (301), which may be realized by any of many methods or mechanisms known in the art, is selectively closed to provide a potential and/or signal, Vtx, to point B. Coincidently, a second switch (302) is selectively positioned to provide the potential and/or signal, Vtx, to point C as well. A third switch (303) is selectively opened such that no potential is applied to point A. A fourth switch (304) is selectively closed to provide a potential to point D. With the external potentials and signals applied as indicated, the multi-function FED will function in the first mode of operation.

Figure 3B:
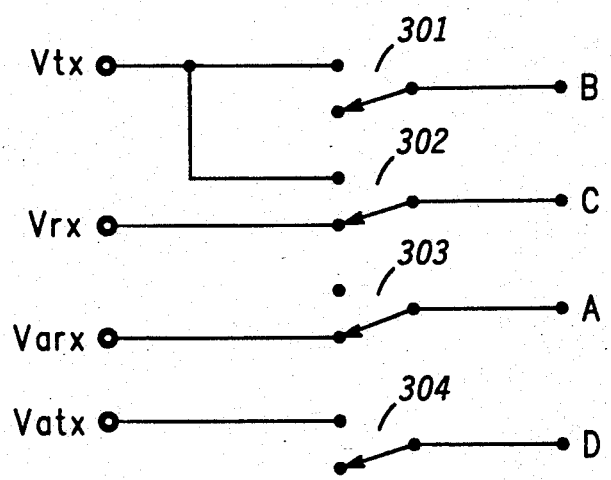

FIG. 3B depicts an alternative arrangement of externally provided signals and potentials. Here, the first, second, third, and fourth switches (301, 302, 303, and 304) are selectively configured as shown, such that the multi-function FED will function in the second mode of operation.

The first mode of operation effectively employs substantially all of the plurality of FEDs of the multifunction FED as a single active device with substantially all emitted electrons being collected at the plurality of anode electrodes that comprise the first anode electrode.

In contrast, the second mode of operation effectively employs, at most, only part of the plurality of FEDs; i.e., those that correspond to only those FEDs selectively electrically interconnected by the second selective electrical interconnect (202). Further, in this second mode of operation the first and second anodes (103 and 203) are selectively energized such that the second anode electrode (203) collects substantially all emitted electrons.

Figure 4:
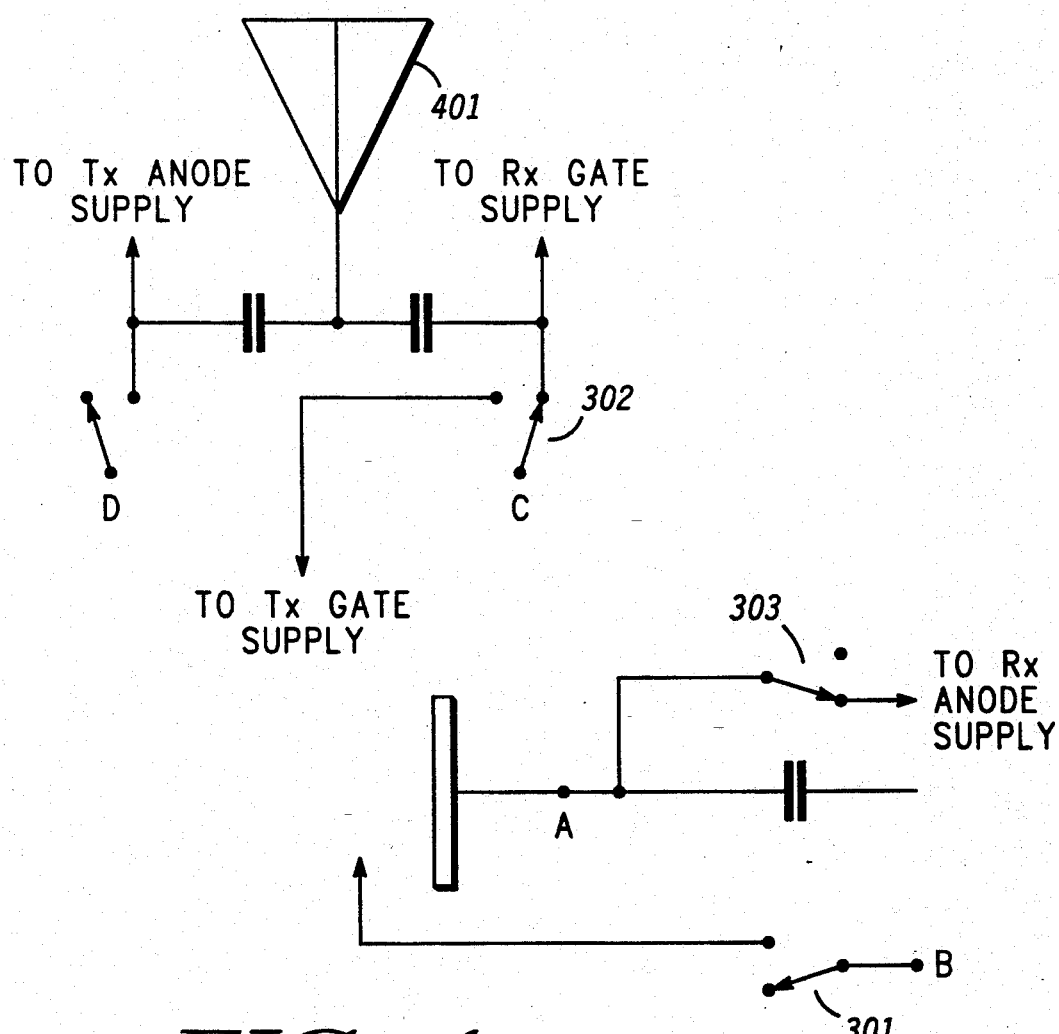
FIG. 4 is a schematic representation of a first mode of a possible application of a multi-function FED of the present invention.

An RF receiver amplifier using the multi-function FED appears in FIG. 4. An antenna circuit functioning in a receive mode (401) couples through the second switch (302) to point C of the multi-function FED. The external third switch (303) couples an externally provided anode potential to point A of the multi-function FED. The first and fourth switches (301 and 304) are preferentially un-energized, but may alternatively be selectively energized with an externally provided potential such that the FEDs associated with the first selective electrical interconnect (201) will emit substantially no electrons.

Figure 5:
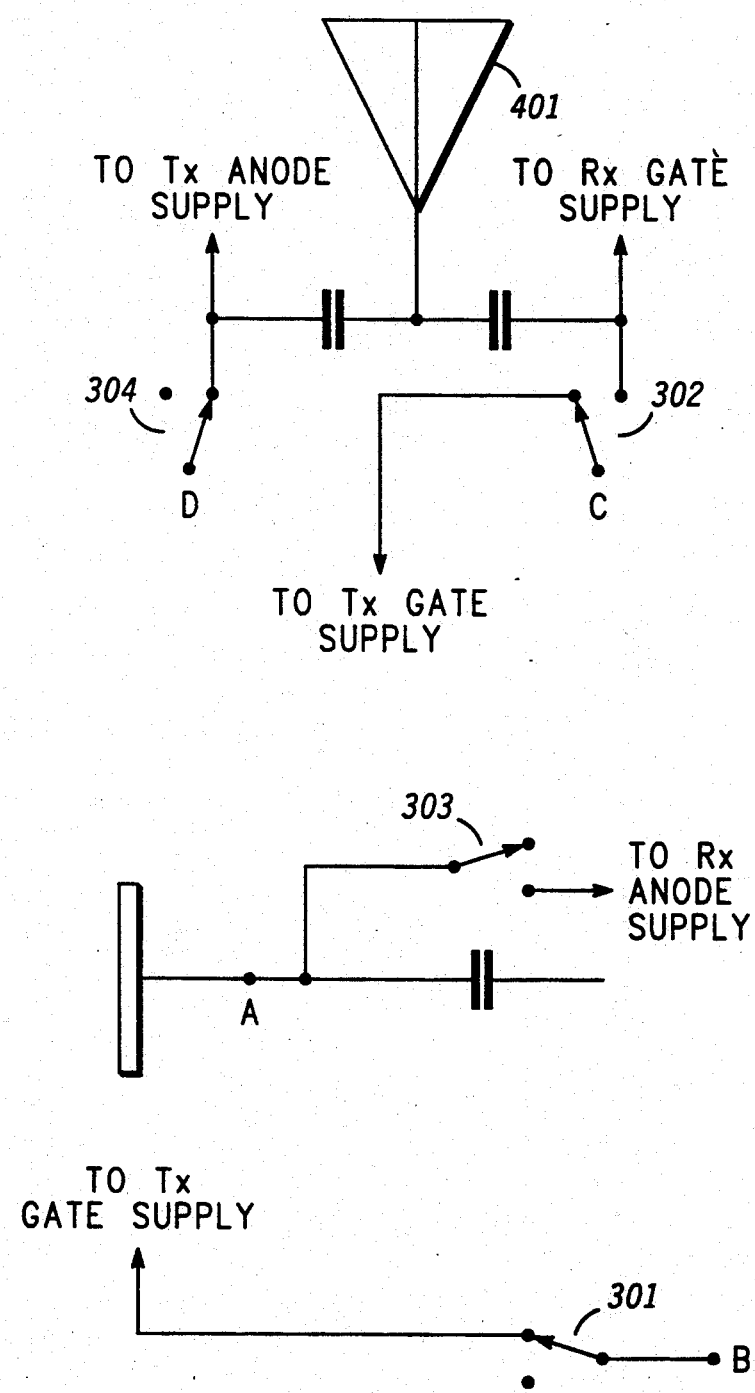
FIG. 5 is a schematic representation of a second mode of a possible application of a multi-function FED of the present invention.

FIG. 5 depicts an application that employs the multi-function FED in the second mode of operation. Here, an antenna circuit (401) functioning as a transmit antenna circuit operably couples through the selectively energized fourth switch (304) to point D. Coincidently, a TX gate supply operably couples through the first and second switches (301 and 302) to points B and C, such that substantially all of the plurality of FEDs are operating in concert as a single active device. Further, the third switch (303) effectively de-couples point A from any externally provided potential and/or signal, or may alternatively be selectively energized with an externally provided potential such that any electrons emitted from any of the plurality of FEDs are not collected by the second anode electrode (203).

The two distinct modes of operation described above are implemented by selectively preferentially energizing some or all of a plurality of FEDs of a single array of FEDS in a single multi-function FED. Additional modes of operation, described previously in this disclosure, indicate that a single multi-function FED may be selectively preferentially energized to provide a plurality of electronic functions greater than two. Additionally, it is anticipated that the switching functions described may be integrated within a single structure that also includes the multi-function FED to provide a monolithic multi-function FED.

Figure 6A:
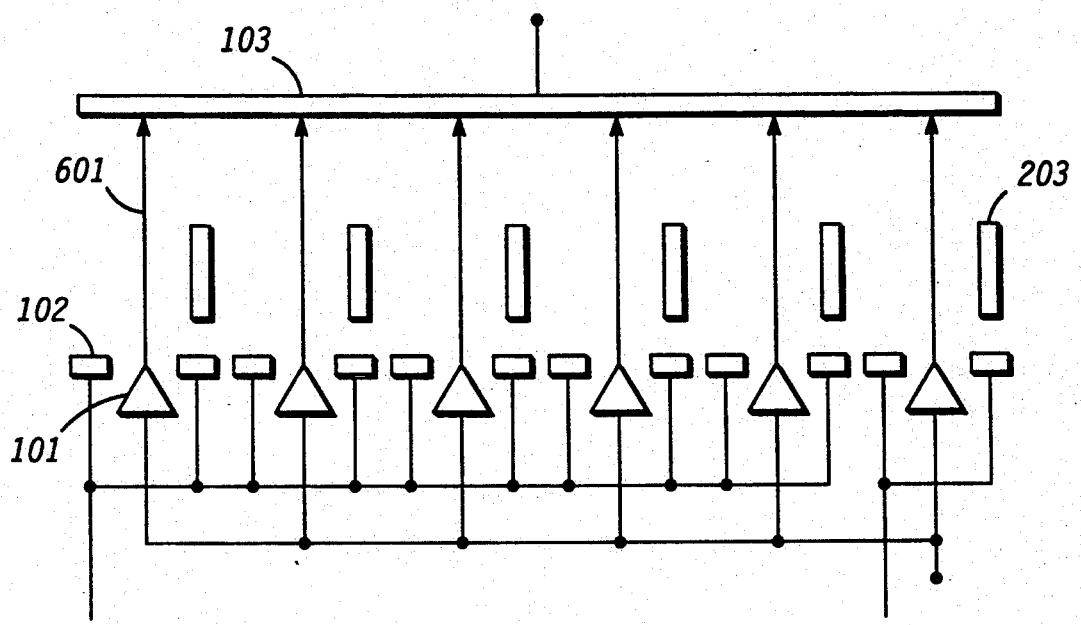
FIGS. 6A-6B are schematic representations of a second embodiment multi-function FED in accordance with the present invention.

FIG. 6A depicts a multi-function FED that has been selectively independently energized such that substantially all of the FEDs of the plurality of FEDs are operating in concert as a single active device. In this mode of operation substantially all of the emitted electrons (601) will be collected by the first anode electrode (103).

Figure 6B:
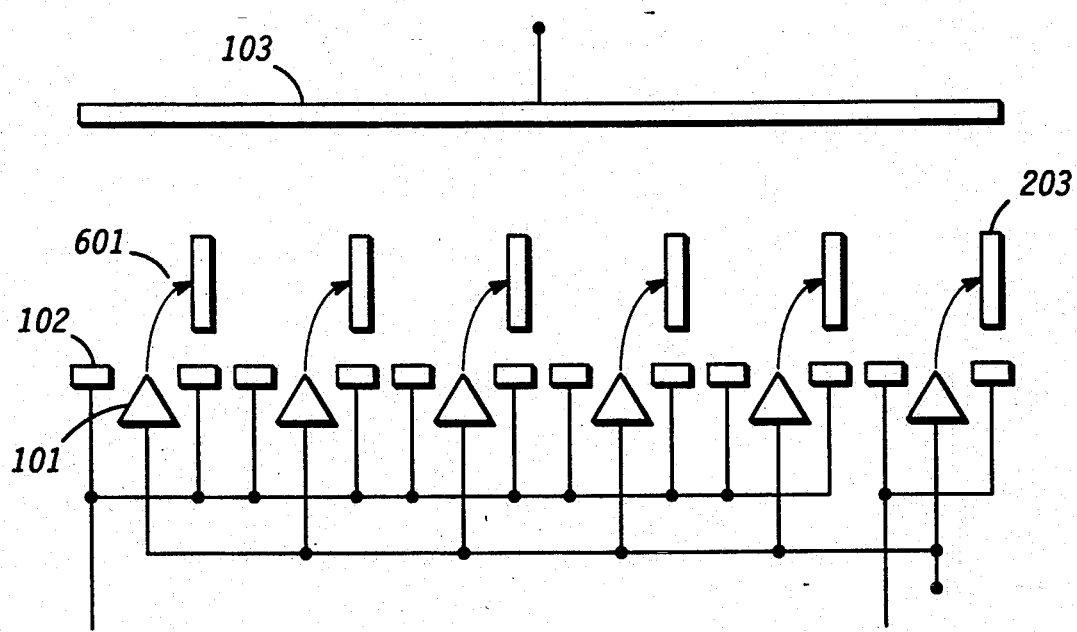

Referring now to FIG. 6B there is shown a schematic representation of the multi-function FED, first described above with reference to FIG. 6A, and selectively independently preferentially energized such that the plurality of anode electrodes corresponding to a plurality of second anode electrodes (203) will each collect substantially all of any emitted electrons (601) from the plurality of FEDs associated with each single second anode electrode (203) of the plurality of second anode electrodes (203). So energized the multi-function FED of FIG. 6B functions as a plurality of parallel devices with independent outputs.

Various modifications and extensions to the modes of operation described herein are anticipated that will yield single active electronic devices employing an array of FEDs wherein the single array of FEDs may be selectively preferentially independently energized by externally provided potentials and signals to provide a plurality of electronic circuit functions.

What is claimed is:

1. An electronic device, comprising:
   A) a plurality of cold cathode electron emitters;
   B) first coupling means for coupling the plurality of cold cathode electron emitters together, such that a drive signal applied to one of the cold cathode electron emitters will be simultaneously applied to all of the cold cathode electron emitters;
   C) first anode means disposed proximal to all of the plurality of cold cathode electron emitters, for collecting emitted electrons when operating in a collecting mode of operation;
   D) second anode means disposed proximal to at least one, but not all, of the plurality of cold cathode electron emitters, for collecting emitted electrons when operating in a collecting mode of operation, the second anode means, when operating in the collecting mode of operation, collecting substantially all electrons emitted by the cold cathode electron emitter disposed proximal thereto, regardless of whether the first anode means is also operating in a collecting mode of operation.

2. An electronic device, comprising:
   A) a plurality of cold cathode electron emitters;
   B) first coupling means for coupling the plurality of cold cathode electron emitters together, such that a drive signal applied to one of the cold cathode electron emitters will be simultaneously applied to all of the cold cathode electron emitters;
   C) first anode means disposed proximal to all of the plurality of cold cathode electron emitters, for collecting emitted electrons when operating in a collecting mode of operation; and
   D) second anode means disposed proximal to at least one, but not all, of the plurality of cold cathode electron emitters, for collecting emitted electrons when operating in a collecting mode of operation, wherein the first anode means, when operating in the collecting mode of operation, collects substantially all electrons emitted by all cold cathode electron emitters, provided that the second anode means is not also operating in the collecting mode of operation.

3. An electronic device, comprising;
   A) a plurality of cold cathode electron emitters;
   B) first coupling means for coupling the plurality of cold cathode electron emitters together, such that a drive signal applied to one of the cold cathode electron emitters will be simultaneously applied to all of the cold cathode electron emitters;
   C) first anode means disposed proximal to all of the plurality of cold cathode electron emitters, for collecting emitted electrons when operating in a collecting mode of operation; and
   D) second anode means disposed proximal to at least one, but not all, of the plurality of cold cathode electron emitters, for collecting emitted electrons when operating in a collecting mode of operation,
   E) first gate means positioned proximal to a first group of at least one of the cold cathode electron emitters for selectively facilitating extraction of electrons from the first group of cold cathode electron emitters;
   F) second gate means positioned proximal to a second group of at least one of the cold cathode electron emitters for selectively facilitating extraction of electrons from the second group of cold cathode electron emitters;
   wherein the first group comprises different cold cathode electron emitters than the second group.

4. The electronic device of claim 3, wherein the first and second gate means further function to selectively facilitate a rate of extraction of electrons from the cold cathode electron emitters.

5. The electronic device of claim 3, wherein both the first and second gate means can be substantially identically controlled in a first mode of operation to cause the cold cathode electron emitters associated with such first and second gate means to emit electrons in a substantially similar manner to one another.

6. The electronic device of claim 3, wherein the first and second gate means can be controlled differently from one another in a second mode of operation to cause the cold cathode electron emitters associated with such first and second gate means to emit electrons in a substantially different manner from one another.

7. The electronic device of claim 6, further comprising:
   G) first coupling means for selectively coupling the first anode means to an antenna to thereby enable the electronic device to operate as an RF transmitter power amplifier;
   H) second coupling means for selectively coupling the second gate means to an antenna to thereby enable the electronic device to operate as an RF receiver amplifier.

8. The electronic device of claim 7, wherein the first coupling means and the second coupling means both couple to the same antenna.

9. An electronic device comprising:
A) at least a plurality of field emission devices each of the field emission devices including an emitter electrode and a gate extraction electrode proximally disposed to the emitter electrode such that a potential difference between the gate extraction electrode and the emitter electrode substantially determines the rate of emission of electrons from the emitter electrode, and wherein at least some of the gate extraction electrodes and emitter electrodes are selectively independently electrically interconnected to form a first group of field emission devices, wherein any individual field emission devices not associated with the first group, and each field emission device of the first group, may be selectively externally energized by application of pre-determined operating potentials; and
B) a plurality of anode electrodes, some of which anode electrodes are selectively independently electrically interconnected to form a first group and a second group of anode electrodes, the anode electrodes being distally disposed with respect to the gate extraction electrodes and emitter electrodes to collect at least some of any electrons emitted by the emitter electrodes, wherein each of the first and second groups of anode electrodes may be selectively independently externally energized by application of pre-determined operating potentials, such that each of the individual field emission devices and the group of field emission devices may be selectively electrically energized to operate:
in a first mode as a single active device wherein the first group of anode electrodes collects substantially all of the emitted electrons collected by any anode electrodes of the plurality of anode electrodes; and
in a second mode as a single active device wherein the second group of anode electrodes collects substantially all of the emitted electrons collected by any anode electrodes of the plurality of anode electrodes.

10. The electronic device of claim 9, wherein:
A) the first mode comprises an RF transmitter power amplifier mode; and
B) the second mode comprises an RF receiver amplifier mode.

11. An electronic device comprising:
A) a plurality of field emission devices, each of the field emission devices being comprised of at least an emitter electrode and a gate extraction electrode proximally disposed to the emitter electrode such that a potential difference between the gate extraction electrode and the emitter electrode will substantially determine a rate of emission of electrons from the emitter electrode, and wherein at least some of the gate extraction electrodes and emitter electrodes are selectively independently electrically interconnected to form at least a first group of field emission devices, wherein any individual field emission devices not associated with a group of the at least a first group, and each group of the at least a first group, may be selectively externally energized by application of pre-determined operating potentials; and
B) a plurality of anode electrodes, some of which anode electrodes are selectively independently electrically interconnected to form a first group and at least a second group of anode electrodes, the anode electrodes being distally disposed with respect to the gate extraction electrodes and emitter electrodes to collect at least some of any electrons emitted by the emitter electrodes, wherein each anode electrode of the first group and at least second group of anode electrodes may be selectively independently externally energized by application of pre-determined operating potentials, such that each of the field emission devices and the first and second groups of field emission devices may be selectively electrically energized to operate:
in a first mode as a single active device wherein at most the first group of anode electrodes collects substantially all of the emitted electrons collected by any anode electrodes of the plurality of anode electrodes; and
in a second mode as a plurality of independent active devices and wherein at most the at least second group of anode electrodes collects substantially all of the emitted electrons collected by any anode electrodes of the plurality of anode electrodes.

12. The electronic device of claim 11, wherein:
A) the first mode comprises an RF transmitter power amplifier mode; and
B) the second mode provides a plurality of RF receiver amplifier devices.

13. An electronic device comprising:
A) a plurality of field emission devices, each of the field emission devices being comprised of at least an emitter electrode and a gate extraction electrode proximally disposed to the emitter electrode such that a potential difference between the gate extraction electrode and the emitter electrode will substantially determine a rate of emission of electrons from the emitter electrode, and wherein at least some of the gate extraction electrodes and emitter electrodes are selectively independently electrically interconnected to form at least a first group of field emission devices, wherein any individual field emission devices not associated with a group of the at least a first group, and each group of the at least a first group, may be selectively externally energized by application of pre-determined operating potentials; and
B) a plurality of anode electrodes, some of which of anode electrodes are selectively independently electrically interconnected to form at least a first group and a second group of anode electrodes, the anode electrodes distally disposed with respect to the at least gate extraction electrodes and emitter electrodes to collect at least some of any electrons emitted by the emitter electrodes, wherein each of the at least first and second groups of anode electrodes may be selectively independently externally energized by application of pre-determined operating potentials, such that each of the field emission devices and the groups of field emission devices may be selectively electrically energized to operate:
in a first mode as a single active device wherein substantially all of the at least first group and second group of anode electrodes collect substantially all of the emitted electrons collected by any anode electrodes;

in a second mode as a single active device wherein at most the second group of anode electrodes collects substantially all of the emitted electrons collected by any anode electrodes of the plurality of anode electrodes.

14. The electronic device of claim 13, wherein:
A) the first mode comprises an RF transmitter power amplifier device mode; and
B) the second mode comprises an RF receiver amplifier device.

15. The electronic device of claim 13, wherein;
A) the first mode comprises an RF transmitter power amplifier device with integral sampler function mode; and
B) the second mode comprises an RF receiver amplifier device mode.

* * * * *